(12) United States Patent
Hong et al.

(10) Patent No.: US 9,514,881 B2
(45) Date of Patent: Dec. 6, 2016

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Zhongshan Hong, Shanghai (CN); Xianyong Pu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 9 days.

(21) Appl. No.: 14/797,128

(22) Filed: Jul. 11, 2015

(65) Prior Publication Data

US 2016/0035816 A1    Feb. 4, 2016

(30) Foreign Application Priority Data

Jul. 29, 2014    (CN) .......................... 2014 1 0367357

(51) Int. Cl.
| | | |
|---|---|---|
| *H01L 27/08* | (2006.01) | |
| *H01L 27/22* | (2006.01) | |
| *H01L 23/495* | (2006.01) | |
| *H01L 23/48* | (2006.01) | |
| *H01F 41/04* | (2006.01) | |
| *H01L 21/48* | (2006.01) | |

(Continued)

(52) U.S. Cl.
CPC ........ *H01F 41/041* (2013.01); *H01F 27/2804* (2013.01); *H01L 21/4814* (2013.01); *H01L 23/5227* (2013.01)

(58) Field of Classification Search
CPC ...... H01L 28/10; H01L 21/4814; H01L 22/34; H01L 23/66; H01L 24/05; H01L 23/5227; H01L 23/64; H01L 2224/16; H01L 2924/01025; H01L 2924/01077; H01F 27/2804; H01F 41/041
USPC ........................ 257/531, 666, 737, 427, 499, E21.022,257/773, E23.068, E23.141; 438/3, 381, 109; 363/17
See application file for complete search history.

(56) References Cited

U.S. PATENT DOCUMENTS

2002/0186106 A1* 12/2002 Miller ..................... H01L 23/48
                                                    333/247
2005/0174131 A1*  8/2005 Miller .................. G01R 1/0491
                                                    324/750.3

(Continued)

*Primary Examiner* — Dzung Tran
(74) *Attorney, Agent, or Firm* — Anova Law Group, PLLC

(57) ABSTRACT

A semiconductor structure is provided. The semiconductor structure includes a substrate; and a plurality of parallel first conductive layers formed on the substrate. The semiconductor structure also includes a composite magnetic structure having a plurality of magnetic layers and a plurality of insulation layers with a sandwich arrangement formed on a portion of the substrate and portions of surfaces of the plurality of first conductive layers. Further, the semiconductor structure includes a plurality of first conductive vias and a plurality of second conductive vias formed on the first conductive layers at both sides of the composite magnetic structure. Further, the semiconductor structure also includes a plurality of second conductive layers formed on a top surface of the composite magnetic structure, top surfaces of the first conductive vias, and top surfaces of the second conductive vias to form at least one coil structure wrapping around the composite magnetic structure.

13 Claims, 7 Drawing Sheets

(51) Int. Cl.
*H01F 27/28* (2006.01)
*H01L 23/522* (2006.01)

(56) References Cited

U.S. PATENT DOCUMENTS

| | | | |
|---|---|---|---|
| 2006/0273418 A1* | 12/2006 | Chung | G11C 11/16 257/421 |
| 2007/0003781 A1* | 1/2007 | de Rochemont | B82Y 30/00 428/615 |
| 2007/0121249 A1* | 5/2007 | Parker | G01R 33/04 360/123.1 |
| 2007/0139976 A1* | 6/2007 | deRochemont | B82Y 30/00 363/17 |
| 2008/0246104 A1* | 10/2008 | Ranjan | G11C 11/5607 257/421 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201410367357.3, filed on Jul. 29, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

A transformer is a device that is used to change alternating voltage based on the Faraday law of electromagnetic induction. A regular transformer includes a primary coil, a secondary coil, and a magnetic core (a shared magnetic field). The transformer is able to transfer electrical energy from the primary coil to the secondary coil through the first coil and the secondary coil wrapped around the magnetic core.

The basic principle of the transformer includes passing an electric current through the primary coil to induce a magnetic field (electromagnetism) in the magnetic core. Then, the electric current in the primary coil is changed to change the strength of the magnetic field in the magnetic core. Further, the changing magnetic field induces an electric current in the secondary coil sharing the same magnetic core (magnetic field) with the primary coil. Thus, the energy is transferred from the primary coil to the secondary coil.

FIG. 1 illustrates an existing transformer. As shown in FIG. 1, the transformer includes a magnetic core 100. The magnetic core 100 has a loop shape. The transformer also includes a primary coil 101 and a secondary coil 102 wrapping around the magnetic core 100. The primary coil 101 is independent of the secondary coil 102; and the primary coil 101 is electrically isolated from the secondary coil 102. When a voltage is applied on both ends ("+" and "−") of the primary coil 101, an electrical current is passing through the primary coil 101. The current induces a magnetic field in the magnetic core 100. If the voltage is an alternating voltage, the magnetic field in the magnetic core 100 is also an alternating magnetic field. The alternating magnetic field is able to induce an electric potential between the two ends ("+" and "−") of the secondary coil 102. When a load is connected with the two ends of the secondary coil 102, an electric current is generated in the secondary coil 102.

However, such transformer may not have a desired stability. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate; and forming a plurality of parallel first conductive layers on one surface of the substrate. The method also includes forming a composite magnetic structure having a plurality of magnetic layers and a plurality of insulation layers with a sandwich arrangement on a portion of the surface substrate and portions of surfaces of the plurality of first conductive layers. Further, the method includes forming a plurality of first conductive vias and a plurality of second conductive vias on the plurality of first conductive layers at both sides of the first conductive layers, respectively. Further, the method also includes forming a plurality of second conductive layers on a top surface of the composite magnetic structure, top surfaces of the first conductive vias, and top surfaces of the second conductive vias to form at least one coil structure wrapping around the composite magnetic structure.

Another aspect of the present disclosure includes a semiconductor structure. The semiconductor structure includes a substrate; and a plurality of parallel first conductive layers formed on the substrate. The semiconductor structure also includes a composite magnetic structure having a plurality of magnetic layers and a plurality of insulation layers with a sandwich arrangement formed on a portion of a surface of the substrate and portions of surfaces of the plurality of first conductive layers. Further, the semiconductor structure includes a plurality of first conductive vias and a plurality of second conductive vias formed on the first conductive layers at both sides of the composite magnetic structure, respectively. Further, the semiconductor structure also includes a plurality of second conductive layers formed on a top surface of the composite magnetic structure, top surfaces of the first conductive vias and, top surfaces of the second conductive vias to form at least one coil structure wrapping around the composite magnetic structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
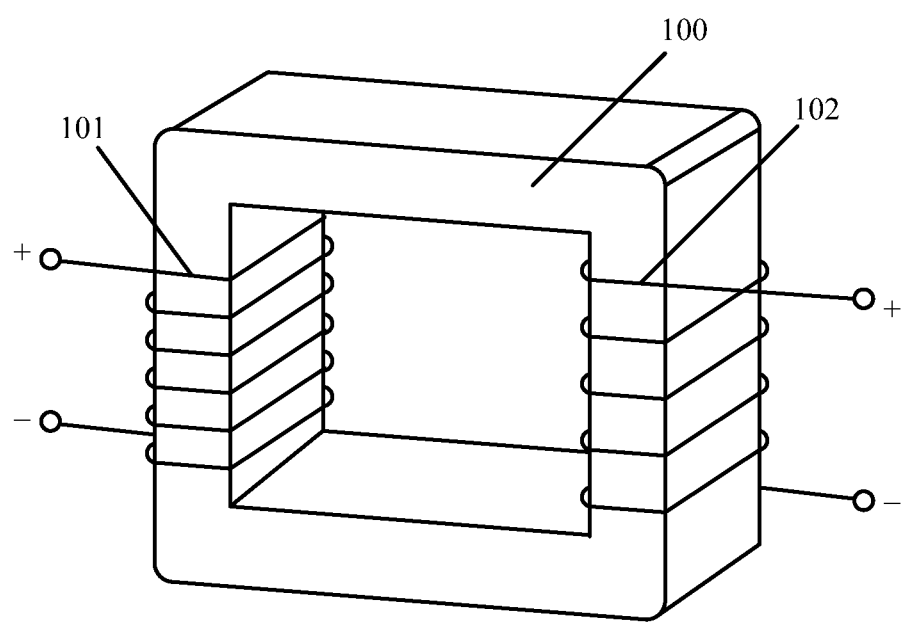
FIG. 1 illustrates an existing transformer.

The performance of the transformer illustrated in FIG. 1 may be unstable because a disturbing current may be generated in the magnetic core 100. The disturbing current may cause a detrimental effect to the stability of the induced current in the secondary coil 102. Referring to FIG. 1, after the current is inputted in the primary coil 101, the primary coil 101 may induce a magnetic field in the magnetic core 100. When the current in the primary coil 101 is changed, the magnetic field induced by the primary coil 101 may change accordingly.

The magnetic core 100 may be made of a magnetic material, such as Fe, or Co, etc. The magnetic material may also be a conductive material. Thus, when the magnetic field induced by the primary coil 101 is changed, the electrical charges in the magnetic core 100 may move along a certain direction. Further, the magnetic core 100 is a loop structure. Thus, the magnetic core 100 may form a close loop for an electrical current.

Therefore, when the electrical charges in the magnetic core 100 moves along the certain direction, it may be easy to form an electric current in the magnetic core 100. That is, the disturbing current may be formed. The disturbing current may reduce the energy transferred from the primary coil 101 to the secondary coil 102. Such an energy lost may cause the induced current in the secondary coil 102 to be unstable. Further, it may be easy to cause the magnetic core 100 to generate heat. Thus, the performance of the transformer may be reduced; and the stability of the transformer may be affected.

Figure 10:
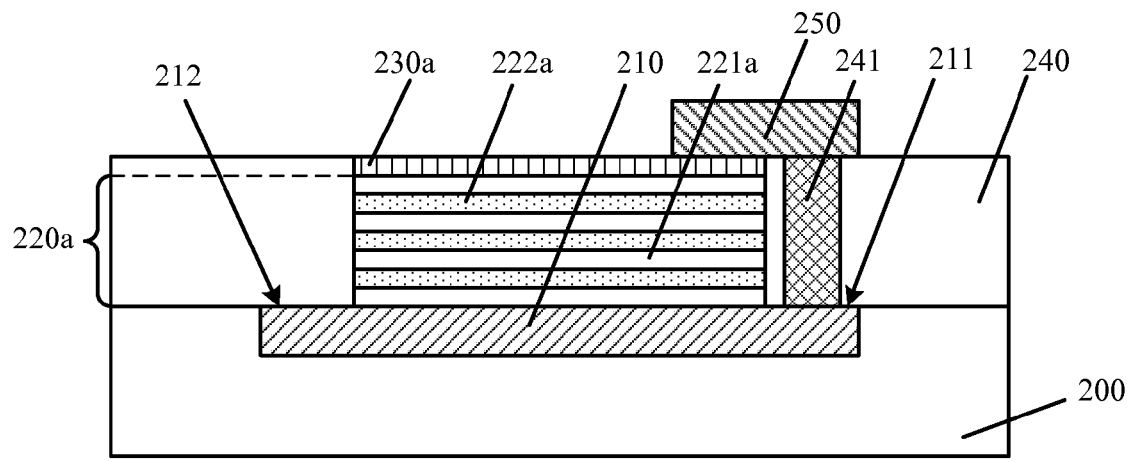
Figure 11:
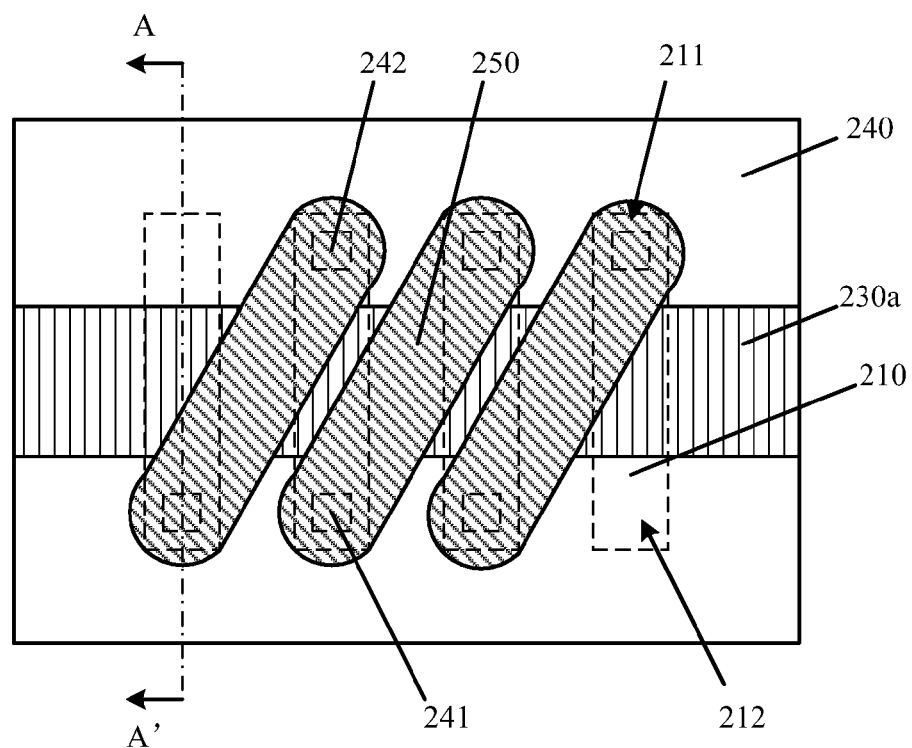
Figure 12:
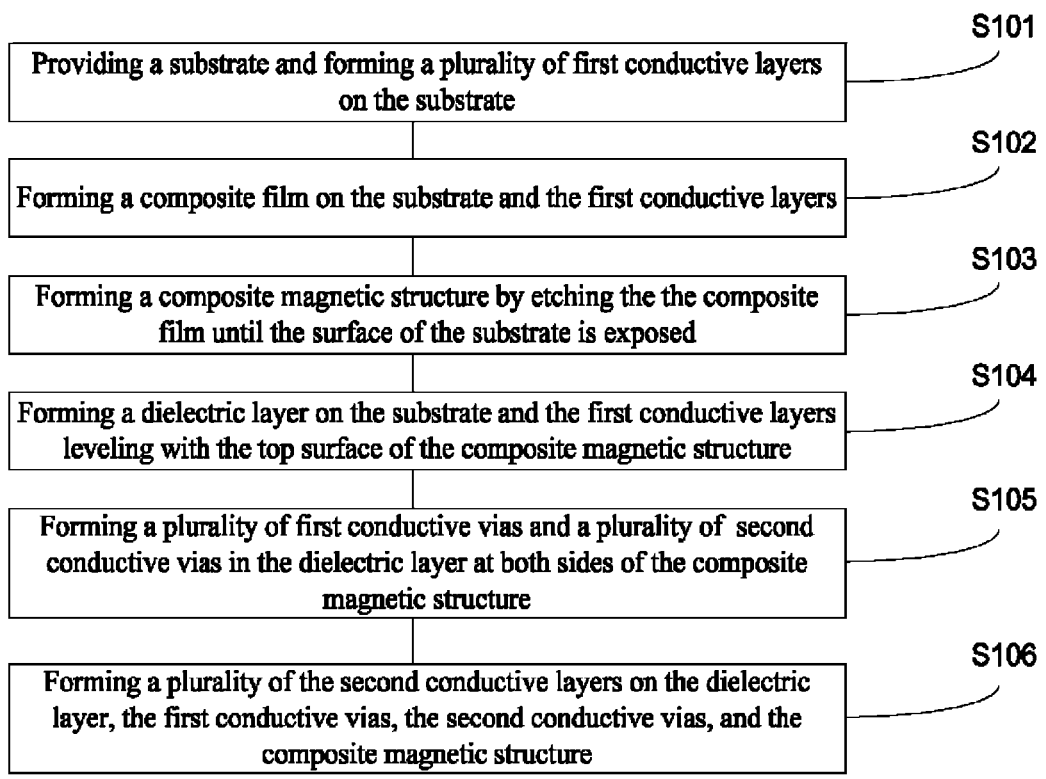
FIG. 12 illustrates an exemplary fabrication process of a semiconductor structure consistent with the disclosed embodiments.

According to the disclosed methods and device structures, the stability issues and other related issues may be overcome by forming a composite magnetic structure having a plurality of the insulated magnetic layers to be configured as the magnetic core. FIG. 12 illustrates an exemplary fabrication process of a semiconductor structure consistent with the disclosed embodiments; and FIGS. 2~11 illustrate semiconductor structures corresponding to certain stages of the exemplary fabrication process.

Figure 2:
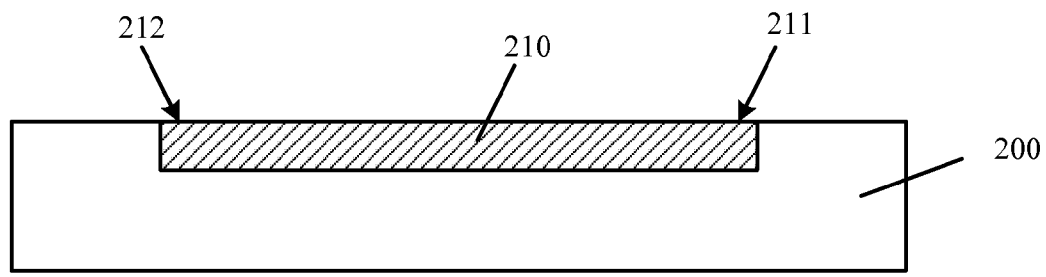
FIGS. 2~11 illustrate semiconductor structures corresponding to certain stages of an exemplary fabrication process of a semiconductor structure consistent with the disclosed embodiments.
Figure 3:
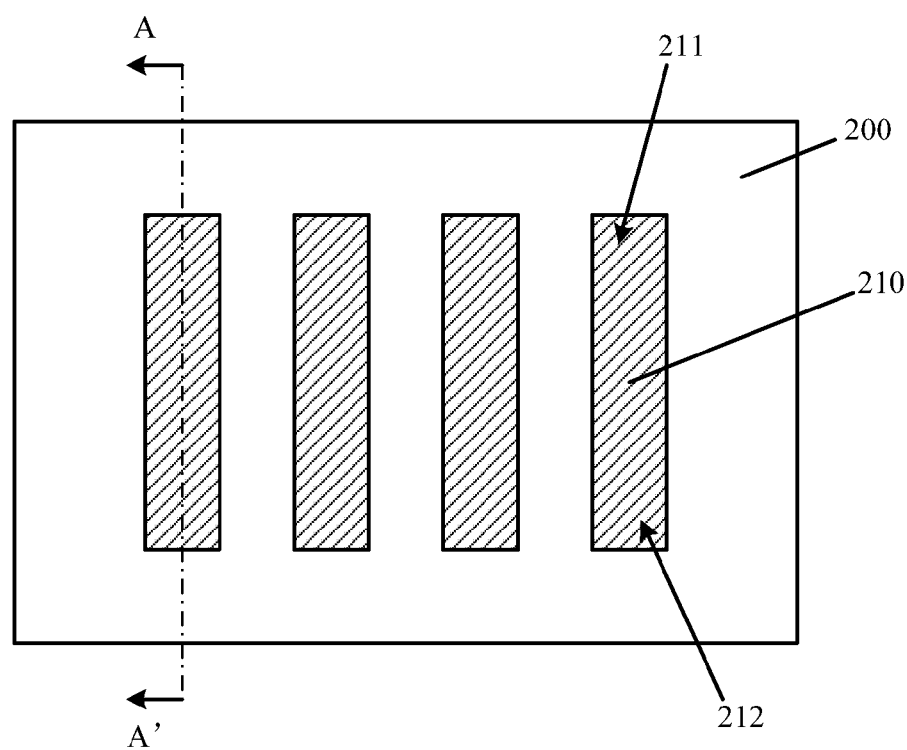

As shown in FIG. 12, at the beginning of the fabrication process, a substrate with certain structures is provided (S101). FIGS. 2~3 illustrate a corresponding structure; and FIG. 2 illustrates a cross-section view of the structure illustrated in FIG. 3.

As shown in FIGS. 2~3, a substrate 200 is provided; and a plurality of first conductive layers 210 are formed on the substrate 200. The first conductive layers 210 may also be referred as first metal bars 210. The surfaces of the plurality of first conductive layers 210 may level with the surface of the substrate 200. Further, the plurality of the first conductive layers 210 may be parallel to each other; and each of the first conductive layer 210 may have a first port 211 and a second port 212. The first ports 211 of the plurality of first conductive layers 210 may be at same sides of the plurality of first conductive layers 210. Correspondingly, the second ports 212 of the plurality of first conductive layers 210 may be at the other side of the plurality of the first conductive layers 210.

The substrate 200 may include a semiconductor substrate or a glass substrate (not labeled), and a device layer (not labeled) formed on the surface of the semiconductor substrate. The semiconductor substrate may include any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof. The semiconductor substrate provides a base for subsequent devices and processes.

The device layer may include device structures (not shown) formed on the surface of the semiconductor substrate, a first dielectric layer (not shown) formed on the surface of the devices structures, and electrical interconnect structures (not shown) formed in the first dielectric layer. The first dielectric layer may cover the device structures and the electrical interconnect structures. Thus, the device structures may be electrically insulated from the electrical interconnect structures except the required contact pads.

The first dielectric layer may be made of any appropriate material, such as one or more silicon oxide, silicon nitride, silicon oxynitride, low dielectric constant (low-K) material, or ultra-low-K dielectric material, etc. Various processes may be used to form the first dielectric layer, such as a chemical vapor deposition (CVD) process, a physical vapor deposition (PVD) process, an atomic layer deposition (ALD) process, or a flowable CVD (FCVD) process, etc.

The electrical interconnect structures may electrically connect with the device structures, and/or the semiconductor substrate. Thus, the device structures and the electrical interconnect structures may form a chip circuit. The electrical interconnect structures may include contact vias (not shown) formed on the device structures and/or the semiconductor substrate, and metal interconnect lines (not shown) formed on the contact vias. The electrical interconnect structures may be made of any appropriate material, such as one or more of Cu, W, Al, Ti, SiN, Ta, and TaN, etc.

Further, referring to FIGS. 2~3, in one embodiment, the plurality of first conductive layers 210 may be formed in the first dielectric layer. The surfaces of the first conductive layers 210 may level with the surface of the first dielectric layer. Further, the first conductive layers 210 may be electrically connected with the metal interconnect structures.

The first conductive layers 210 may be made of any appropriate material, such as Cu. or Al, etc. A process for forming the first conductive layers 210 may include forming a first conductive material layer on the first dielectric layer; and followed by etching the first conductive material layer to form the plurality of first conductive layers 210. The first conductive material layer may be formed by any appropriate process, such as an electroplating process, a chemical plating process, a CVD process, or a PVD process, etc. The first conductive material layer may be etched by any appropriate process, such as a wet etching process, a dry etching process, or an ion beam etching process, etc.

The plurality of first conductive layers 210 may be electrically connected with subsequently formed second conductive layers through subsequently formed first conductive vias and second conductive vias. Thus, the first conductive layers 210, the first conductive vias, the second conductive vias; and the second conductive layers may form a coil structure. The coil structure may wrap around the subsequently formed composite magnetic structure to form an inductor.

Further, a plurality of first conductive vias may be subsequently formed on the surfaces of the first ports 211 of the first conductive layers 210. A plurality of second conductive vias may be subsequently formed on the surfaces of the second ports 212 of the first conductive layers 210. A first conductive via and a second conductive via formed on a same first conductive layer 210 may connect with two different subsequently formed second conductive layers, respectively. Thus, a conductive path may be formed; and the conductive path may form the coil structure of an inductor. The number of the first conductive layers 210 may be at least two. In one coil structure, the number of the first conductive layers 210 may determine the turns of the coil structure. The number of the turns of the coil structure may determine the strength of the magnetic field induced by the coil structure.

Figure 4:
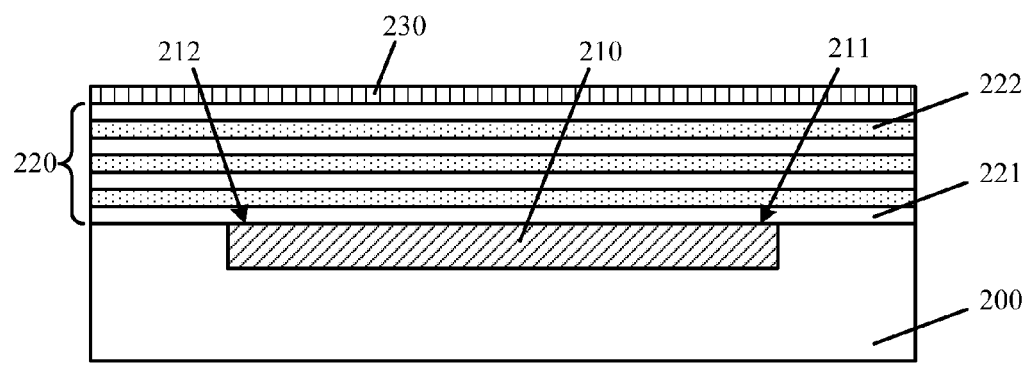

Returning to FIG. 12, after providing the substrate 200 and forming the plurality of first conductive layers 210, a composite film may be formed (S102). FIG. 4 illustrates a corresponding structure.

As shown FIG. 4, a composite film 220 is formed on the surface of the substrate 200 and the surfaces of the first conductive layers 210. The composite film 220 includes a plurality of insulation films 221 and a plurality of magnetic films 222 with a sandwich arrangement. That is, a magnetic film 222 is formed in between two adjacent insulation films 221; and an insulation film 221 is formed between two adjacent magnetic films 222. The first layer connecting with the substrate 200 and the first conductive layers 210 may be an insulation film 221.

The composite film 220 may be used to subsequently form a composite magnetic structure. The magnetic films 222 may be used to subsequently form the magnetic layers of the magnetic core disposed inside the coil structure of the integrated inductor. The insulation films 221 may be used to electrically insulate the adjacent magnetic films 222. Further, the insulation film 221 formed on the substrate 200 and the first conductive layers 210 may be used to electrically insulate the magnetic films 222 from the substrate 200 and the first conductive layers 210.

Referring to FIG. 4, the number of the magnetic films 222 may be equal to or greater than two. The plurality of the magnetic films 222 may be stacked together. Two adjacent magnetic films 222 may be electrically insulated by the insulation films 221.

A process for forming the composite film 220 may include forming an insolation film 221 on the surface of the substrate 200, and the surfaces of the first conductive layers 210; forming a magnetic film 222 on the insolation film 221; and forming another insolation film 221 on the magnetic film 222. The process may be repeated until the pre-determined numbers of magnetic films 222 and insolation films 221 are reached. In one embodiment, the number of the magnetic films 222 may be in a range of approximately 2~100.

The magnetic films 222 may be made of any appropriate material, such as Co, CoFeB, NiFe, NiB, or Ni, etc. The thickness of the magnetic films 222 may be in a range of approximately 10 nm~100 nm. Various processes may be used to form the magnetic films 222, such as a CVD process, a PVD process, an FCVD process, or an ALD process, etc.

The insulation films 221 may be made of any appropriate material, such as SiO, SiN, low-K material, polymer, or metal oxide, etc. The thickness of the insulation films 221 may be in a range of approximately 10 nm~100 nm. Various processes may be used to form the insulation films 221, such as a CVD process, a PVD process, an FCVD process, or an ALD process, etc.

Further, referring to FIG. 4, in one embodiment, after forming the composite film 220, a stop film 230 may be formed on the surface of the composite film 230. The stop film 230 may be used to subsequently form a stop layer. The stop layer may be used as a polishing stop layer when a dielectric layer is subsequently formed. The stop layer may also be used to protect the top surface of the subsequently formed composite magnetic structure when the composite magnetic structure is formed.

The stop film 230 may be made of a material different than that of the subsequently formed dielectric layer and the insolation films 221. In one embodiment, the stop film 230 may be made of SiN, or amorphous carbon, etc. Various processes may be used to form the stop film 230, such as a CVD process, a PVD process, an FCVD process, or an ALD process, etc.

Figure 5:
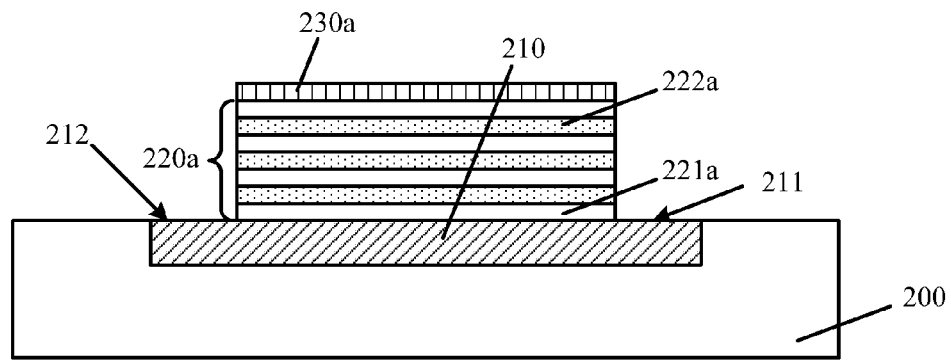
Figure 6:
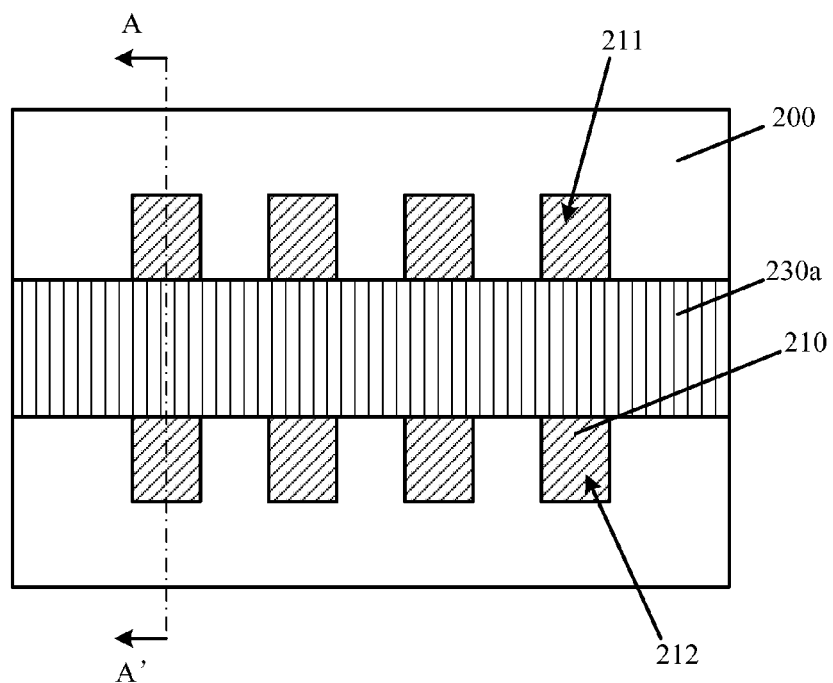

Returning to FIG. 12, after forming the composite film 220, a composite magnetic structure may be formed (S103). FIGS. 5~6 illustrate a corresponding structure; and FIG. 5 is a cross-section view of the structure illustrated in FIG. 6 along the AA' direction.

As shown in FIGS. 5~6, a composite magnetic structure 220a is formed on the surface of the substrate 200, and the surfaces of the plurality of first conductive layers 210 by etching the composite film 220. The composite magnetic structure 220a may also be referred as a composite magnetic bar 220a.

The composite magnetic structure 220a may include a plurality of magnetic layers 222a and a plurality of insulation layers 221a with a sandwich arrangement. That is, referring to FIG. 5, a first magnetic layer 222a is formed in between two adjacent insulation layers 221a; and an insulation layer 221a is formed in between two adjacent magnetic layers 220a. Further, the magnetic composite structure 220a may cover at the surfaces of at least two adjacent first conductive layers 210. Further, the magnetic composite structure 220a may expose the surfaces of the first ports 211 and the second ports 212 of the plurality of the first conductive layers 210.

A process for forming the composite magnetic structure 220a may include forming a first patterned mask layer (not shown) exposing a portion of the surface of the composite film 220; etching the composite film 220 until the surfaces of the substrate 200 and the first ports 211 and the second ports 212 of the first conductive layers 210 are exposed using the first patterned mask layer as an etching mask; and removing the first patterned mask layer. Thus, the composite magnetic structure 220a may be formed. The composite film 220 may be etched by any appropriate process, such as a dry etching process, a wet etching process, or an ion beam etching process, etc.

Referring to FIG. 4, in one embodiment, the stop film 230 may be formed on the surface of the composite layer 220. Thus, the first patterned mask layer may be formed on the stop film 230. Then, referring to FIGS. 5~6, the stop film 230 may be etched to form the stop layer 230a on the magnetic composite structure 220a before etching the composite film 220 to form the composite magnetic structure 220a. The stop layer 230a may prevent the surface of the composite magnetic structure 230a from being damaged during the process for removing the first patterned mask layer.

The first patterned mask layer may be made of any appropriate material. In one embodiment, the first patterned mask layer is a patterned photoresist layer. The first patterned photoresist layer may be formed by spin-coating a photoresist layer on the stop film 230; and followed by exposing and developing the photoresist layer. The patterned photoresist layer may cover the portion of the composite film 220 for forming the composite magnetic structure 220a. After etching the composite film 220 to form the composite magnetic structure 220a, the patterned photoresist layer may be removed by a wet etching process, a dry etching process, or a plasma ashing process, etc.

The composite magnetic structure 220a may include at least two magnetic layers 222a; and the adjacent two magnetic layers 222a may be electrically insulated by the insulation layer 221a. Further, the bottom magnetic layer 222a of the composite magnetic structure 220a may be electrically insulated from the substrate 200 and the first conducive layers 210 by one insulation layer 221a. Further, the top surface of the top magnetic layer 221a of the composite magnetic structure 220a may also be covered by one insulation layer 221a. Thus, the top magnetic layer 222a may be electrically insulated from subsequently formed second conductive layers.

The plurality of magnetic layers 222a may be configured as the magnetic core disposed in the subsequently formed coil structure. The plurality of magnetic layers 222a may be insulated by the insulation layers 221a. Thus, the electrical charges in the magnetic layers 222a may be unable to move along the direction perpendicular to the substrate 200 when an electrical current passes through the subsequently formed coil structure. Therefore, it may not generate a disturbing current along the direction perpendicular to the substrate 200.

Further, because the plurality of magnetic layers 222a are stacked together, and the thickness of each of the magnetic layer 222a may be substantially small. Thus, the cross-section area along the AA' direction of each of the magnetic layers 222a may be substantially small. The substantially small area may cause the electrical charges to be difficult to move along a direction parallel to the surface of the substrate 200. Thus, it may be unable to form a disturbing current in the magnetic layers 222a along the direction parallel to the surface of the substrate 200. Therefore, the efficiency of the electro-magnetic conversion between the subsequently formed coil structure and the magnetic core having the plurality of the magnetic layers 222a may be improved. The improved conversion efficiency may improve the performance and the stability of the semiconductor structure.

In one embodiment, the first conductive layers 210, the subsequently formed conductive vias, and the subsequently formed second conductive layers may form a coil structure. The coil structure may wrap around the composite magnetic structure 220a. The composite magnetic structure 220a may be over the surfaces of at least two first conductive layers 210. Therefore, it may ensure that at least one turn of the coil structure to wrap around the composite magnetic structure 220a.

The number of the composite magnetic structure 220a may be equal to or greater than one. In one embodiment, the number of the composite magnetic structure 220a is one. The one composite magnetic structure 220a and at least one turn of coil structure may be configured as an inductor.

In certain other embodiments, when the number of the composite structures 220a is greater than one. The plurality of composite magnetic structures 220a may be independent, e.g., two dimensional array of composite magnetic structures. Each of the plurality of composite magnetic structures 220a may be over the surfaces of at least two first conductive layers 210. Because the plurality of composite magnetic structures 220a are independent, the plurality of magnetic layers 222a in a same layer may also be independent. When electrical charges generated in the plurality of magnetic layers 222a move along a certain direction, the movement of the electrical charges along the direction parallel to the surface of the substrate 200 may be prevented. Thus, a disturbing current along the direction parallel the surface of the substrate 200 may be prevented from being formed in the plurality of magnetic layers 222a.

In certain other embodiments, at least one trench may be formed in the first patterned mask layer. The trench may expose a portion of the surface of the composite film 220. Further, the trench may be parallel to the first conductive layers 210; and the trench may penetrate through the first patterned mask layer. Thus, after etching the composite film 220 using the first patterned mask layer, a plurality of discrete composite magnetic structure 220a may be formed. That is, a long composite magnetic structure may be separated into a plurality of composite structures 220a by grooves along the longitudinal direction of the long composite structure. The grooves may be parallel to the first conductive layers 210. Similarly, the disturbing current may be prevented because the plurality of magnetic layers 222a may be independent.

In certain other embodiments, the grooves may be formed by a separated process. Specifically, after forming the composite magnetic structure 220a, a second patterned mask layer having trenches may be formed on the composite magnetic structure 220a. The trenches may be parallel to the first conductive layers 210; and expose portions of the composite magnetic structure 220a. Then, the composite magnetic structure 220a may be etched until the surface of the substrate 200 is exposed using the second patterned mask layer as an etching mask. Thus, a plurality of sub-composite magnetic structures are formed; and the plurality of the sub-magnetic composite magnetic structures may be independent. Thus, a disturbing current may be prevented.

The second patterned mask layer may be removed by a wet etching process, or a dry etching process. The second patterned mask layer may be made of any appropriate material, such as photoresist, etc.

Figure 7:
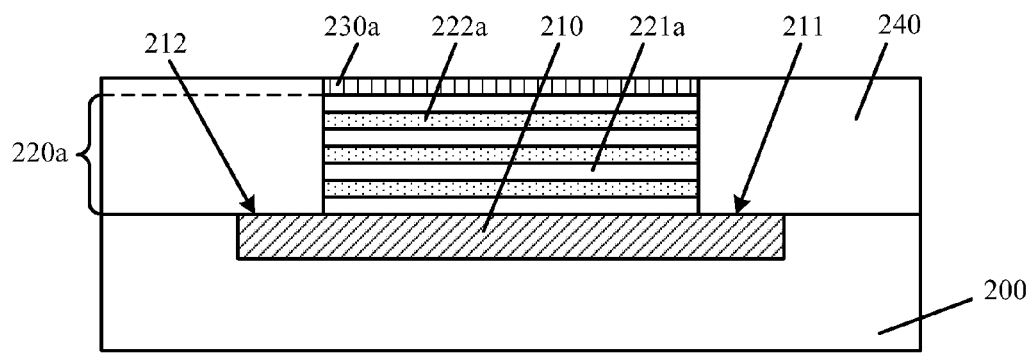

Returning to FIG. 12, after forming the composite magnetic structure 220a, a dielectric layer may be formed (S104). FIG. 7 illustrates a corresponding structure.

As shown in FIG. 7, a dielectric layer 240 is formed on the first conductive layers 210 and the substrate 200. The top surface of the dielectric layer 240 may level with the top surface of the composite magnetic structure 220a. First conductive vias and second conductive vias may be subsequently formed in the dielectric layer 240. Further, second conductive layers may be subsequently formed on the surface of the dielectric layer 240. The first conductive layers 210, the first conductive vias, the second conductive vias, and the second conductive layers may together form at least one coil structure wrapping around the composite magnetic structure 220a. Therefore, the dielectric layer 240 may be used to electrically insulate the adjacent first conductive vias; and adjacent second conductive vias.

A process for forming the dielectric layer 240 may include forming a dielectric material layer to cover the substrate 200, the first conductive layers 210, and the composite magnetic structure 220a; and followed by planarizing the dielectric material layer until the top surface of the composite magnetic structure 220a is exposed. Thus, the dielectric layer 240 may be formed.

The dielectric material layer may be made of any appropriate material, such as silicon oxide, silicon nitride, silicon oxynitride, low-K material, or ultra low-K material, etc. Various processes may be used to form the dielectric material layer, such as a CVD process, a PVD process, an FCVD process, or an ALD process, etc.

The planarization process may be a chemical mechanical polishing process, a physical mechanical polishing process, or an etch back process, etc. In one embodiment, because the stop layer 230a may be formed on the composite magnetic structure 220a, the stop layer 230a may prevent the top surface of the composite magnetic structure 220a from being damaged during the planarization process. Thus, it may ensure the stability of the semiconductor structure.

Figure 8:
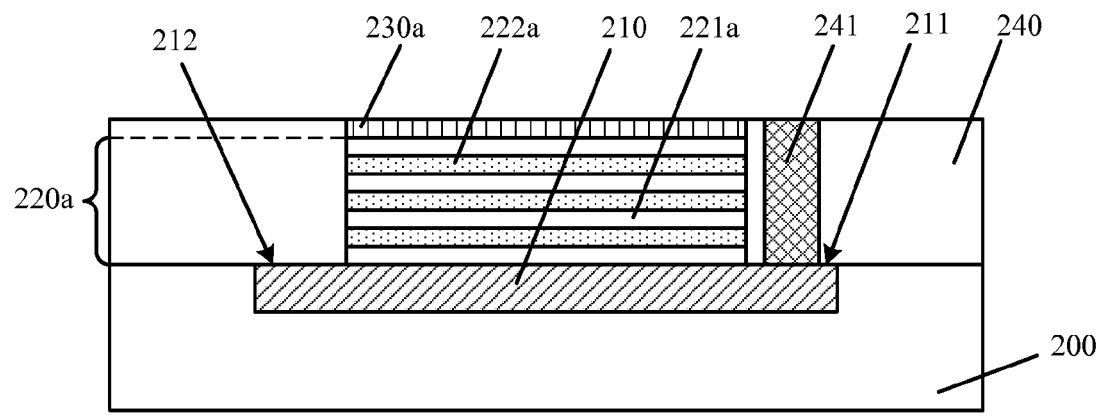
Figure 9:
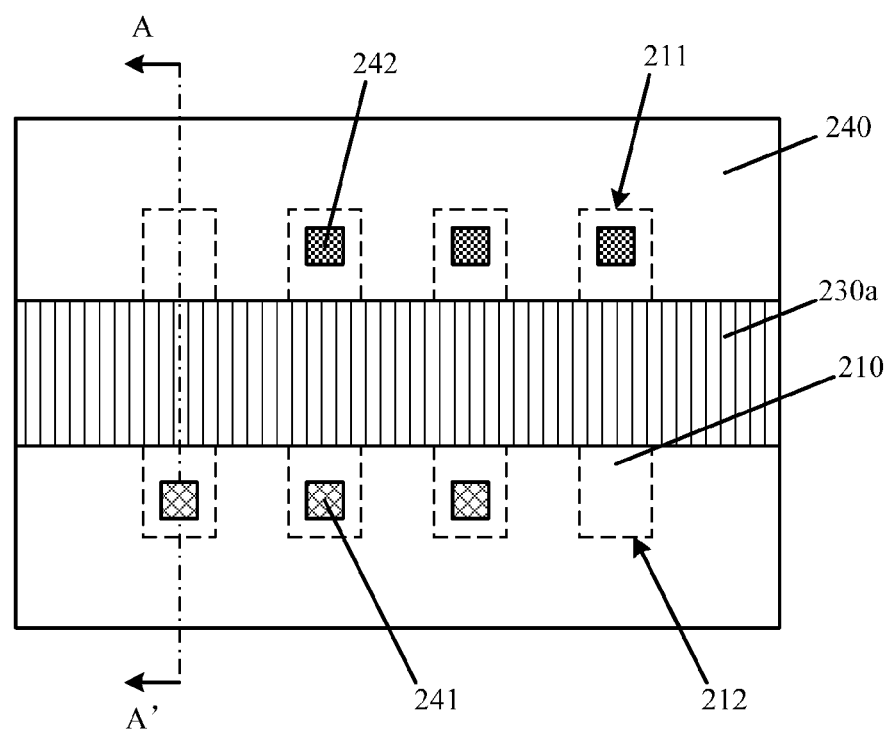

Returning to FIG. 12, after forming the dielectric layer 240, a plurality of first conductive vias and a plurality of second conductive vias may be formed (S105). FIGS. 8~9 illustrate a corresponding structure; and FIG. 8 is a cross-section view of the structure illustrated in FIG. 9 along the AA' direction.

As shown in FIGS. 8~9, a plurality of first conductive vias 241 and a plurality of the second conductive vias 242 are formed in the dielectric layer 240. The plurality of first conductive vias 241 may formed at one side of the composite magnetic structure 220a. The plurality of second conductive vias 242 may be formed at the other side of the magnetic structure 220a. Further, the plurality of the first conductive vias 241 may be formed on the surfaces of the first ports 211 of the plurality of the first conducive layers 210; and the plurality of the second conductive vias 242 may be formed on the surfaces of the second ports 212 of the plurality of first conductive layers 210.

The plurality of first conductive vias 241 and the plurality of second conductive vias 242 may electrically connect the first conductive layers 210 with the subsequently formed second conductive layers. The first conductive via 241 and the second conductive via 242 formed on a same first conductive layer 210 may connect with two adjacent subsequently formed second conductive layers. Thus, the first port 211 and the second port 212 of the same first conductive layer 210 may electrically connect with the two adjacent second conductive layers. Therefore, the first conductive layers 210, the first conductive vias 241, the second conductive vias 242; and the plurality of subsequently formed second conductive layers may be form at least one coil structure. The coil structure may wrap around the composite magnetic structure 220a. Thus, an electromagnetic induction effect may happen between the coil structure and the composite magnetic structure 220a. That is, an inductor may be formed.

Referring to FIGS. 8~9, in one embodiment, the plurality of the first conductive vias 241 and the plurality of the second conductive vias 242 may be formed in the dielectric layer 240. The top surfaces of the first conductive vias 241 and the top surfaces of the second conductive vias 242 may level with the top surface of the dielectric layer 240. Further, the plurality of first conductive vias 241 and the plurality of second conductive vias 242 may be electrically insulated from the composite magnetic structure 220a by the dielectric layer 240.

The plurality of first conductive vias 241 and the plurality of second conductive vias 242 may be formed by a same process, or by a separate process. In one embodiment, a process for forming the plurality of first conductive vias 241 and the plurality of the second conductive vias 242 may include etching the dielectric layer 240 at both sides of the composite magnetic structure 220a to form a plurality of trenches (not labeled) in the dielectric layer 240. The plurality of the trenches may expose the surfaces of the plurality of first ports 211 and the plurality of second ports 212 of the first conductive layers 210. The process may also include forming a first conductive layer (not labeled) on the surface of the dielectric layer 240, the surface of the stop layer 230a, and in the trenches. The first conductive layer may fill the trenches. Further, the method includes planarizing the first conductive layer to expose the surface of the dielectric layer 240 and the surface of the stop layer 230a. Thus, the plurality of first conductive vias 241 and the plurality of second conductive vias 242 may be formed on the first ports 211 and the second ports 212 in the trenches.

The first conductive vias 241 and the second conductive vias 242 may be made of a same material, or different materials. In one embodiment, the first conductive vias 241 and the second conductive vias 242 are made of Cu, or W, etc.

Various processes may be used to form the first conductive layer, such as a CVD process, a PVD process, or an electroplating process, etc. The planarization process may include a chemical mechanical polishing process, or a physical mechanical polishing process, etc. In one embodiment, the planarization process is a chemical mechanical polishing process.

In certain other embodiments, a barrier layer (not shown) may be formed on the surface of the dielectric layer 240, the surface of the stop layer 230a, and the side surfaces and the bottom surfaces of the trenches before forming the first conductive layer. Then, the first conductive layer may be formed on the barrier layer. After planarizing the first conductive layer, the portion of the barrier layer on the surface of the dielectric layer 240 may be removed. That is, the barrier layer may be formed between the first conductive vias 241 and the dielectric layer 240; and between the second conductive vias 242 and the dielectric layer 240. Thus, the barrier layer may be used to prevent the material of the first conductive vias 241 and the second conductive vias 242 from diffusing into the dielectric layer 240. Further, the barrier layer may also be able to protect the surface of the dielectric layer 240 during the planarization process.

The barrier layer may be made of any appropriate material, such as one or more of Ti, Ta, TiN, or Ta, etc. Various processes may be used to form the barrier layer, such as a CVD process, a PVD process, an FCVD process, or an ALD process, etc.

Returning to FIG. 12, after forming the plurality of first conductive vias 241 and the plurality of second conductive vias 242, a plurality of the second conductive layers may be formed (S106). FIGS. 10~11 illustrate a corresponding semiconductor structure; and FIG. 10 is a cross-section view of the structure illustrated in FIG. 11 along the AA' direction.

As shown in FIGS. 10~11, a plurality of second conductive layers 250 are formed on the surface of the dielectric layer 240, the surfaces of the first conductive vias 241, the surfaces of the second conductive vias 242, and the top surface of the composite magnetic structure 220a. The plurality of the second conductive layers 250 may be parallel. Further, the two ends of each of the second conductive layers 250 may cover the surface of a first conductive via 241 and the surface of a second conductive via 242, respectively. The first conductive via 241 and the second conductive via 242 connected by the second conductive layer 250 may be formed the surfaces of two adjacent first conductive layers 210. That is, referring to FIG. 11, one end of the second conductive layer 250 may connect with the first conductive via 211 connecting with the first port 211 of a first conductive layer 210; and the other end of the second conductive layer 250 may connect with the second conductive via 212 connecting with second port 212 of an adjacent first conductive layer 210.

Further, referring to FIG. 11, the projection view of each of the second conductive layers 250 may have a certain angle with a first conductive layer 210. Such an angle may cause the two ends of each of the second conductive layers 250 to be able to connect with the first conductive via 241 and the second conductive via 242 formed on two adjacent first conductive layers 210. The angle may be determined by the length of the first conductive layers 210, the length of the second conductive layers 250, and the distance between two adjacent first conductive layers 210, etc. In one embodiment, the angle may be in a range of approximately 15°~75°.

Further, the two ends of each of the second conductive layers 250 may electrically connect with two adjacent first conductive layers 210 through the first conductive vias 241 and the second conductive vias 242. Thus, the plurality of the first conductive layers 210, the plurality of second conductive layers 250, the plurality of first conductive vias 241; and the plurality of the second conductive vias 242 may form at least one coil structure (not labeled).

Each coil structure may be a conductive loop; and the coil structure may wrap around the composite magnetic structure 220a. Further, the coil structure may be electrically insulated from the magnetic layers 222a.

In one embodiment, the first conductive layers 210, the second conductive layers 250, the first conductive vias 241, and the second conductive vias 242 may form a connected coil structure. The coil structure may be configured as an inductor. The composite magnetic structure 220a disposed inside the coil structure may be able to enhance the performance of the inductor.

In certain other embodiments, the first conductive layers 210, the second conductive layers 250, the first conductive vias 241, and the second conductive vias 242 may form at least two coil structures. Each of the coil structures may form a conductive loop. Thus, the at least two coil structures and the composite magnetic structure 220a may together form a transformer. Basing upon the Faraday law of electromagnetic induction, the energy in one coil structure (may be referred as the primary coil) may be transferred to the other coil structure (may be referred as the secondary coil) through the composite magnetic structure 220a. Thus, an induced current may be generated in the secondary coil.

Referring to FIGS. 10~11, the composite magnetic structure 220a may be configured as the magnetic core disposed in the coil structure. The composite magnetic structure 220a may be a stacked structure having a plurality of magnetic layers 222a; and adjacent magnetic layers 222a may be electrically insulated. Such a multilayer structure may cause no disturbing current to be formed in the magnetic layers 222a. Thus, it may ensure that no energy lost may happen when the electrical energy is transferred from one coil structure to another coil structure. Therefore, the performance and the stability of the transformer may be improved.

A process for forming the second conductive layers 250 may include forming a second conductive film (not labeled) on the surfaces the dielectric layer 240 and the stop layer 230a; forming a patterned mask layer having the patterns defining the second conductive layers on the second conductive film; and etching the second conductive film until the surface of the dielectric layer 240 and the surface of the stop layer 230a are exposed using the patterned mask layer as an etching mask. Thus, the second conductive layers 250 may be formed.

The second conductive film may be made of any appropriate material, such as Cu, or Al, etc. Various processes may be used to form the second conductive film, such as a PVD process, or an electroplating process, etc.

The second conductive film may be etched by any appropriate process, such as a dry etching process, a wet etching process, or an ion beam etching process, etc. In one embodiment, an anisotropic dry etching process is used to etch the second conductive film to form the second conductive layers 250. During the etching process, the stop layer 230a may be used to protect the top surface of the composite magnetic structure 220a.

Thus, a semiconductor structure may be formed by the above disclosed processes and methods; and the corresponding semiconductor structure is illustrated in FIGS. 10~11. As shown in FIGS. 10~11, the semiconductor structure includes a substrate 200; and a plurality first conductive layers 210 formed in the substrate 200 with top surfaces leveling with the top surface of the substrate 200. The plurality of first conductive layers 210 are parallel; and each of the first conductive layers 210 has a first port 211 and a second port 212. The plurality of first ports 211 are at a same side of the plurality of the first conductive layers 210; and the plurality of second ports 212 are at the other side of the plurality of first conductive layers 210.

The semiconductor structure also includes a composite magnetic structure 220a formed on a portion of the surface of the substrate 200 and a portion of the surfaces of the first conducive layers 210. The composite magnetic structure 220a includes a plurality of insulation layers 221a and a plurality of magnetic layer 222a stacked together with a sandwich arrangement. That is, an insulation layer is 221a is formed between two adjacent magnetic layers 222a; and a magnetic layer 222a is formed in between two adjacent insulation layers 221a. The composite magnetic structure 220a covers the surfaces of least two adjacent first conductive layers 210. Further, the composite magnetic structure 220a exposes the first ports 211 and the second ports 212 of the plurality of first conductive layers 210.

Further, the semiconductor structure includes a dielectric layer 240 formed on the surface of substrate 200 and the surfaces of the first conductive layers 210. The dielectric layer 240 covers the composite magnetic structure 220a. Further, the top surface of the dielectric layer 240 levels with the top surface of the composite magnetic structure 220a.

Further, the semiconductor structure also includes a plurality of first conductive vias 241 and a plurality of second conductive vias 242 formed in the dielectric layer 240 at both sides of the composite magnetic structure 220a. The plurality of first conductive vias 241 are formed on the surfaces of the first ports 211 of the first conductive layers 210. The plurality of second conductive vias 242 are formed on the surfaces of the second ports 212 of the first conductive layers 210. The top surfaces of the first conductive vias 241 and the top surfaces of the second conductive vias 242 level with the top surface of the dielectric layer 240

Further, the semiconductor structure also includes a plurality of second conductive layers 250 formed on the top surface of the dielectric layer 240, the top surface of the composite magnetic structure 220a, the surfaces of the first conductive vias 241, and the surfaces of the second conductive vias 242. The plurality of second conductive layers 250 are parallel. The two ends of each of the second conductive layers 250 connect with one first conductive via 241 and one second conductive via 242, respectively. The first conductive via 241 and the second conductive via 242 connecting with the two ends of the second conductive layer 250 are formed on the first port 211 of the first conductive layer 210 and the second port 212 of the adjacent first conductive layer 211.

In one embodiment, the first conductive layers 210, the second conductive layers 250, the first conductive vias 241, and the second conductive vias 242 form a coil structure. The coil structure and the composite magnetic structure 220a disposed inside the coil structure form an inductor.

In certain other embodiments, the first conductive layers 210, the second conductive layers 250, the first conductive vias 241, and the second conductive vias 242 form at least two coil structures. The at least two coil structures and the composite magnetic structure 220a disposed inside the two coil structures form a transformer. One coil structure is configured as the primary coil of the transformer. The other coil structure is configured as the secondary coil of the transformer.

According to the disclosed methods and structures, a composite magnetic structure may be formed on the substrate and the first conductive layers. The composite magnetic structure may include at least three insulation layers; and one magnetic layer is formed in between two adjacent insulation layers. That is, the composite magnetic structure may include at least two magnetic layers; and the adjacent magnetic layers may be electrically insulated. The first conductive layers, the second conductive layers, the first conductive vias, and the second conductive vias may form at least one electrically connected loop. The electrically connected loop may wrap around the composite magnetic structure to serve as a coil structure. When electric charges in the magnetic layers induced by the coil structure move along a certain direction, the motion along the direction perpendicular to the substrate may be prevented, because the magnetic layers have a sandwich arrangement; and are electrically insulated. Thus, it may avoid generating an electrical current in the magnetic layers along the direction perpendicular to the substrate.

Further, because the magnetic layers are stacked together (sandwiched structure); and electrically insulated, the cross-section area of each of the magnetic layers may be substantially small, it may be difficult for the electrical charges to move along the direction parallel to the substrate. Thus, the disturbing current in the magnetic layers may be reduced. Therefore, the stability of the semiconductor structure may be improved. When the semiconductor structure is configured as a transformer, the energy lose may be reduced during the energy transfer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a substrate;
   a plurality of parallel first conductive layers formed in the substrate, a top surface of a first conductive layer levelling with a top surface of the substrate;
   a composite magnetic structure having a plurality of magnetic layers and a plurality of insulation layers with a sandwich arrangement formed on a portion of a surface of the substrate and portions of surfaces of the plurality of the first conductive layers, each magnetic layer being sandwiched between two insulation layers;
   a plurality of first conductive vias and a plurality of second conductive vias formed on the first conductive layers at both sides of the composite magnetic structure; and
   a plurality of second conductive layers formed on a top surface of the composite magnetic structure, top surfaces of the first conductive vias, and top surfaces of the second conductive vias to form at least one coil structure wrapping around the composite magnetic structure.

2. The semiconductor structure according to claim 1, wherein:
   each of the first conductive layers has a first port and a second port;
   a plurality of first ports is at a same side of the first conductive layers; and
   a plurality of second ports is at another side of the first conductive layers.

3. The semiconductor structure according to claim 2, wherein:
   the composite magnetic structure exposes the first ports and the second ports of the first conductive layers; and
   the plurality of the first conductive vias are formed on a surface of the plurality of first ports of the first conductive layers; and
   the plurality of the second conductive vias are formed on a surface of the plurality of second ports of the first conductive layers.

4. The semiconductor structure according to claim 1, wherein:
   two ends of each of the second conductive layers connect with a first conductive via and a second conductive via respectively; and
   the first conductive via and the second conductive via connecting with the second conductive layer are formed on two adjacent first conductive layers respectively.

5. The semiconductor structure according to claim 1, wherein:
   the composite magnetic structure includes a stop layer on the top surface contacting the second conductive layers, an insulation layer under and contacting the stop layer, and an insulation layer on and contacting the first conductive layers; and
   except for the insulation layer under and contacting the stop layer and the insulation layer on and contacting the first conductive layers, each insulation layer is sandwiched between two magnetic layers.

6. The semiconductor structure according to claim 1, wherein:
   a number of the magnetic layers is in a range of 2~100.

7. The semiconductor structure according to claim 1, wherein:
   the magnetic layers are made of one or more of Co, Fe, CoFeB, NiFe, NiB, and Ni.

8. The semiconductor structure according to claim 1, wherein:
   the insulation layers are made of one or more of $SiO_2$, SiN, low dielectric constant material, polymer, and metal oxide.

9. The semiconductor structure according to claim 1, wherein:
   the first conductive layers and the second conductive layers are made of one or more of Al and Cu.

10. The semiconductor structure according to claim 1, wherein:
    the first conductive vias and the second conductive vias are made of one or more of Cu and W.

11. The semiconductor structure according to claim 1, wherein:
    a number of the at least one coil structures is more than two; and
    the at least one coil structures and the composite magnetic structure are configured as a transformer.

12. The semiconductor structure according to claim 1, further including:
    a dielectric layer formed on the surface of the substrate and the first conductive layers;and
    a top surface of the dielectric layer levels with the top surface of the composite magnetic structure, the top surfaces of the first conductive vias, and the top surfaces of the second conductive vias, a top surface of a second conductive layer being higher than the top surface of the composite magnetic structure, the top surfaces of the first conductive vias, the top surfaces of the second conductive vias, and a top surface of the dielectric layer.

13. The semiconductor structure according to claim 1, wherein:
    a projection view of the second conductive layers on the substrate has an angle with the first conductive layers, the angle being in a range of approximately 15°~75°.

* * * * *